(12) United States Patent
Huang et al.

(10) Patent No.: US 11,335,716 B2
(45) Date of Patent: May 17, 2022

(54) PHOTOSENSING PIXEL, IMAGE SENSOR AND METHOD OF FABRICATING THE SAME

(71) Applicant: Taiwan Semiconductor Manufacturing Co., Ltd., Hsinchu (TW)

(72) Inventors: Sin-Yao Huang, Tainan (TW); Feng-Chi Hung, Hsin-Chu County (TW); Chen-Hsien Lin, Tainan (TW); Tzu-Hsuan Hsu, Kaohsiung (TW); Yan-Chih Lu, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 123 days.

(21) Appl. No.: 16/805,860

(22) Filed: Mar. 2, 2020

(65) Prior Publication Data

US 2021/0193712 A1 Jun. 24, 2021

Related U.S. Application Data

(60) Provisional application No. 62/953,472, filed on Dec. 24, 2019.

(51) Int. Cl.
*H01L 27/146* (2006.01)

(52) U.S. Cl.
CPC .. *H01L 27/14612* (2013.01); *H01L 27/14621* (2013.01); *H01L 27/14627* (2013.01); *H01L 27/14689* (2013.01)

(58) Field of Classification Search
None
See application file for complete search history.

(56) References Cited

U.S. PATENT DOCUMENTS

| 2010/0194955 | A1 | 8/2010 | Lee |
| 2012/0085888 | A1 | 4/2012 | Endo et al. |
| 2013/0009039 | A1 | 1/2013 | Sato et al. |
| 2016/0079438 | A1 | 3/2016 | Miyairi et al. |
| 2018/0040741 | A1 | 2/2018 | Miyairi et al. |
| 2018/0190694 | A1* | 7/2018 | Ihara ............... H01L 27/14641 |

(Continued)

FOREIGN PATENT DOCUMENTS

| KR | 20050104083 | 11/2005 |
| KR | 20180115391 | 10/2018 |

(Continued)

OTHER PUBLICATIONS

"Office Action of Korea Counterpart Application", dated Sep. 16, 2021, p. 1-p. 4.

(Continued)

*Primary Examiner* — Ali Naraghi
(74) *Attorney, Agent, or Firm* — JCIPRNET

(57) ABSTRACT

A photosensing pixel includes a substrate, a photosensing region, a floating diffusion region, a transfer gate and a control electrode. The photosensing region is located within the substrate. The floating diffusion region is located within the substrate aside the photosensing region. The transfer gate is disposed on the substrate and extending into the photosensing region. The control electrode is located on the substrate and extending into the floating diffusion region.

7 Claims, 8 Drawing Sheets

(56) References Cited

U.S. PATENT DOCUMENTS

2018/0301509 A1    10/2018  Ishii et al.
2019/0115388 A1*    4/2019  Jung ................... H01L 27/1464
2019/0267429 A1*    8/2019  Zhang ............... H01L 27/14641
2019/0355778 A1*   11/2019  Zheng ............... H01L 27/14614

FOREIGN PATENT DOCUMENTS

| TW | 201733102 | 9/2017 |
| TW | 201735387 | 10/2017 |
| TW | 201830681 | 8/2018 |
| TW | 201903971 | 1/2019 |
| TW | 201946257 | 12/2019 |
| TW | 201947753 | 12/2019 |

OTHER PUBLICATIONS

"Office Action of Taiwan Counterpart Application", dated Aug. 3, 2021, p. 1-p. 4.

* cited by examiner

PHOTOSENSING PIXEL, IMAGE SENSOR AND METHOD OF FABRICATING THE SAME

CROSS-REFERENCE TO RELATED APPLICATION

This application claims the priority benefit of U.S. provisional application Ser. No. 62/953,472, filed on Dec. 24, 2019. The entirety of the above-mentioned patent application is hereby incorporated by reference herein and made a part of this specification.

BACKGROUND

Complementary Metal-Oxide-Semiconductor (CMOS) image sensors (CIS) are used in numerous applications including digital cameras, for example. Image sensors convert optical images to digital data that may be represented as digital images. An image sensor includes a pixel array (or grid) for detecting light and recording intensity (brightness) of the detected light. The pixel array responds to the light by accumulating a charge. The accumulated charge is then used (for example, by other circuitry) to provide a color and brightness signal for use in a suitable application, such as a digital camera.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
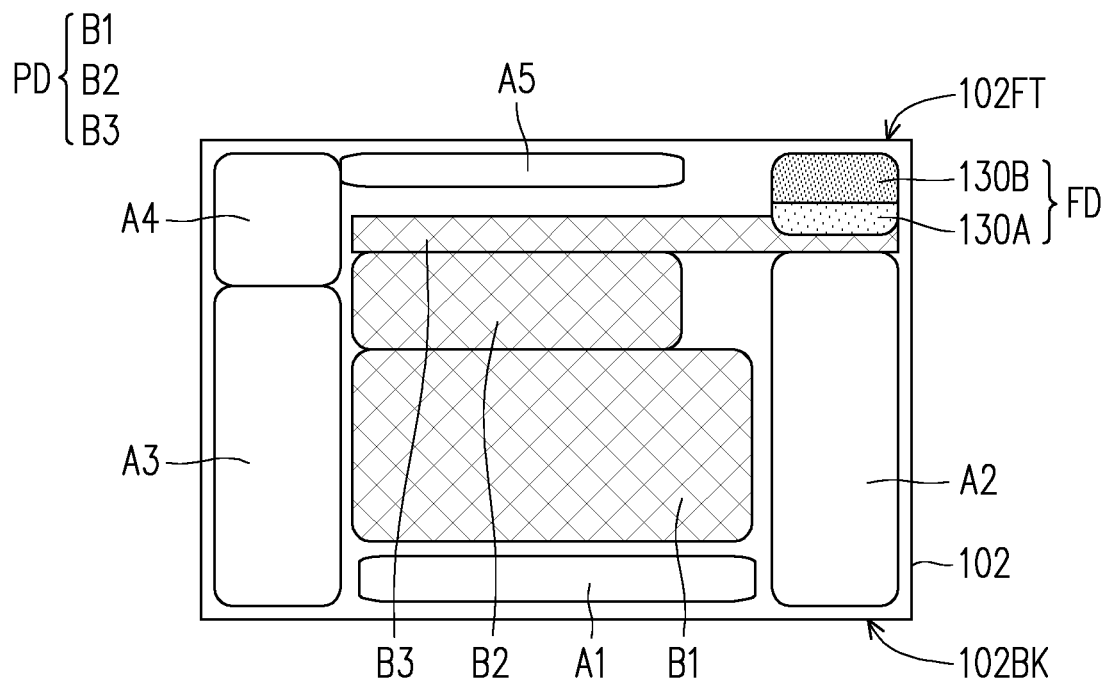
FIG. 1A to FIG. 1E are schematic sectional views of various stages in a method of fabricating an image sensor according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1E are schematic sectional views of various stages in a method of fabricating an image sensor according to some exemplary embodiments of the present disclosure. Referring to FIG. 1A, a substrate 102 having a frontside 102FT and a backside 102BK is provided. In some embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, the substrate 102 is doped with a first dopant having a first conductivity type. Furthermore, a plurality of first doped wells (A1, A2, A3, A4 and A5) of the first conductivity type is formed in the substrate 102. In some embodiments, each of the first doped wells (A1, A2, A3, A4 and A5) have the same or different doping concentrations, and this may be adjusted based on design requirement. For example, the first doped wells (A1, A2, A3, A4 and A5) may have a doping concentration in a range of from about $10^{14}/cm^3$ to about $10^{19}/cm^3$. Although five first doped wells (A1, A2, A3, A4 and A5) are illustrated in FIG. 1A, it should be noted that the number of first doped wells in the substrate 102 is not limited thereto. In some alternative embodiments, the number of first doped wells and the regions of the doped wells may be appropriately adjusted based on design requirement.

Furthermore, in some embodiments, a photosensing region PD may be formed within the substrate 102 by doping the substrate 102 with a second dopant having a second conductivity type. In certain embodiments, the second dopant is different than the first dopant. For example, in one exemplary embodiment, the first dopant is a P-type dopant while the second dopant is a N-type dopant. However, the disclosure is not limited thereto. In some other embodiments, the first dopant is a N-type dopant while the second dopant is a P-type dopant. As illustrated in FIG. 1A, in some embodiments, the photosensing region PD is formed by forming a plurality of second doped wells (B1, B2 and B3) within the substrate 102. In some embodiment, the second doped wells (B1, B2 and B3) may have a doping concentration in a range of from about $10^{14}/cm^3$ to about $10^{19}/cm^3$. In one exemplary embodiment, the doping concentration of the second doped wells (B1, B2 and B3) increases from the frontside 102FT of the substrate 102 towards the backside 102BK of the substrate. In other words, the second doped well B2 may have a doping concentration higher than the second doped well B1, and the second doped well B3 may have a doping concentration higher than the second doped well B2. However, this construes no limitation in the disclosure. In some embodiments, each of the second doped wells (B1, B2 and B3) have the same or different doping concentrations, and this may be adjusted based on design requirement. Similarly, the number of second doped wells and the regions of the doped wells may be appropriately adjusted based on design requirement.

As further illustrated in FIG. 1A, in some embodiments, the photosensing region PD is embedded within the substrate 102 and is surrounded by the first doped wells (A1, A2, A3, A4 and A5). In certain embodiments, upon irradiation of an incident light, the photosensing region PD is able to accumulate image charges in response to the incident light. For example, in some embodiments, the photosensing region PD and the substrate 102 are in contact with each other to form a P-N junction photodiode configured to convert radiation into an electric signal.

In some embodiments, a floating diffusion region FD is disposed within the substrate 102 aside the photosensing region PD. For example, the floating diffusion region FD is disposed from a frontside 102FT of the substrate 102 to a position within the substrate 102. In certain embodiments, the floating diffusion region FD is located on a first doped well A2 of the substrate 102. Furthermore, the floating diffusion region FD may include a lightly doped well 130A of the second conductivity type, and a heavily doped well 130B of the second conductivity type. In some embodiments, the lightly doped well 130A is located on the first doped well A2 of the substrate 102, and the heavily doped well 130B is located on the lightly doped well 130A. In one exemplary embodiment, when the photosensing region PD is doped with a N-type dopant and the substrate 102 is doped with a P-type dopant, then the floating diffusion region FD may include a lightly doped n-well 130A and a heavily doped n-well 130B. In some embodiments, the floating diffusion region FD may serve as a capacitor for storing the image charges.

Figure 1B:
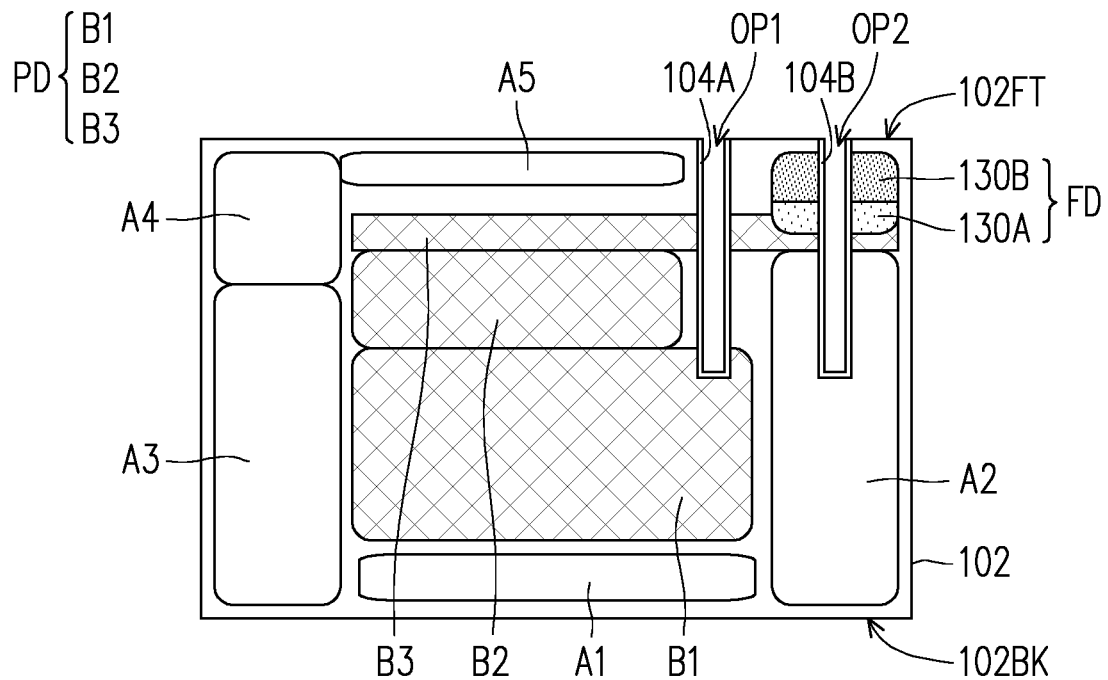

Referring to FIG. 1B, after doping the substrate 102 to form the various doped regions, the substrate 102 may be patterned to form openings (OP1, OP2). In some embodiments, the patterning process may include a photolithography process and an etching process. For example, in some embodiments, an opening OP1 that extends into the photosensing region PD is formed in the substrate 102, and another opening OP2 that extends into the floating diffusion region FD is formed in the substrate 102. In the exemplary embodiment, the opening OP1 extends through the second doped well B3 and extends towards the second doped well B1 of the photosensing region PD. Furthermore, in some embodiments, the opening OP2 extends through the floating diffusion region FD and extends towards the first doped well A2 of the substrate 102. In some embodiments, a depth of the opening OP1 is substantially equal to a depth of the opening OP2. In certain embodiments, the openings OP1 and OP2 are patterned in the same step.

In some embodiments, after forming the openings OP1 and OP2, a gate dielectric 104A may be formed in the opening OP1, and a dielectric layer 104B may be formed in the opening OP2. In some embodiments, the gate dielectric 104A is conformally formed on sidewalls of the opening OP1 to cover the photosensing region PD. In a similar way, the dielectric layer 104B is conformally formed on sidewalls of the opening OP2 to cover the floating diffusion region FD. In some embodiments, the gate dielectric 104A and the dielectric layer 104B are formed of the same material. However, the disclosure is not limited thereto. In alternative embodiments, the gate dielectric 104A and the dielectric layer 104B may be formed of different materials.

In the exemplary embodiment, the gate dielectric 104A and the dielectric layer 104B are formed of materials such as silicon oxide, silicon nitride, silicon oxy-nitride, or high-k dielectric materials. The high-k dielectric materials are generally dielectric materials having a dielectric constant greater than 4. In some embodiments, the high-k dielectric material may include metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, the gate dielectric 104A and the dielectric layer 104B may be formed using a suitable process such as atomic layer deposition (ALD), chemical vapor deposition (CVD), physical vapor deposition (PVD), thermal oxidation, UV-ozone oxidation, or a combination thereof. Furthermore, the gate dielectric 104A and the dielectric layer 104B may be formed in the same step, or may be formed in different steps depending on the selection of their materials.

Figure 1C:
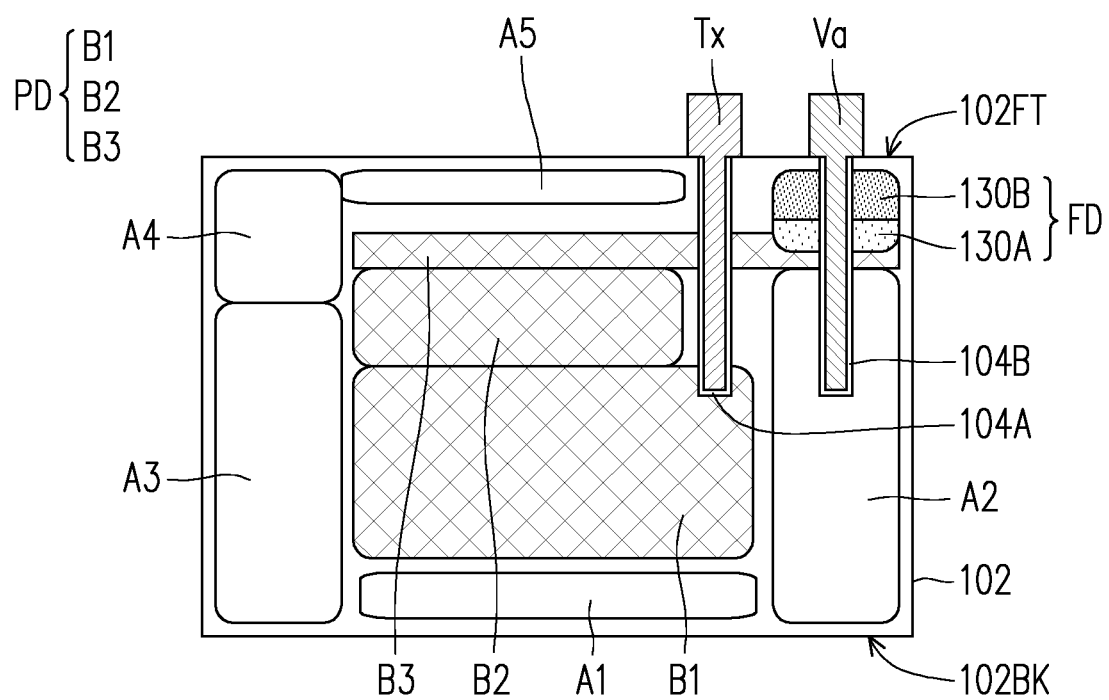

Referring to FIG. 1C, in some embodiments, after forming the gate dielectric 104A and the dielectric layer 104B, a transfer gate Tx (e.g. a vertical transfer gate) and a control electrode Va are respectively formed over the gate dielectric 104A and the dielectric layer 104B and within the openings OP1 and OP2. In some embodiments, the transfer gate Tx is located on the frontside 102FT of the substrate 102 and extending into the photosensing region PD. In some embodiments, the transfer gate Tx is surrounded by the gate dielectric 104A, and separated from the photosensing region PD by the gate dielectric 104A. In certain embodiments, the transfer gate Tx extends into the substrate 102 through the second doped well B3 and extends towards the second doped well B1 of the photosensing region PD. In some embodiments, the control electrode Va is located on the frontside 102FT of the substrate 102 and extending into the floating diffusion region FD. In some embodiments, the control electrode Va is surrounded by the dielectric layer 104B, and separated from the floating diffusion region FD by the dielectric layer 104B. In certain embodiments, the control electrode Va extends into the floating diffusion region FD and into the substrate 102 so that it is surrounded by the first doped well A2, the lightly doped well 130A and the heavily doped well 130B.

Furthermore, in the exemplary embodiment, a depth of the transfer gate Tx extending into the photosensing region PD is substantially equal to a depth of the control electrode Va extending into the floating diffusion region FD. In one exemplary embodiment, the depth of the transfer gate Tx and the depth of the control electrode Va is 0.05 μm or more. Although the depth of the transfer gate Tx and the depth of the control electrode Va is shown to be substantially equal, however, the disclosure is not limited thereto. In some alternative embodiments, the depth of the transfer gate Tx is different than the depth of the control electrode Va. For example, the depth of the transfer gate Tx may be greater than the depth of the control electrode Va. Alternatively, the depth of the transfer gate Tx may be smaller than the depth of the control electrode Va.

In some embodiments, the transfer gate Tx and the control electrode Va may be formed in the same step and formed of the same material. However, the disclosure is not limited thereto. In some alternative embodiments, the transfer gate Tx and the control electrode Va may be formed in different steps and formed of different materials. In some embodiments, the transfer gate Tx and the control electrode Va may be made of materials such as poly-silicon or metal. Furthermore, the transfer gate Tx and the control electrode Va may be formed by using a suitable process such as atomic layer deposition (ALD), chemical vapor deposition (CVD), physical vapor deposition (PVD), plating, or a combination thereof.

In the exemplary embodiment, the transfer gate Tx and the control electrode Va are formed after forming the first doped wells (A1, A2, A3, A4 and A5) and the second doped wells (B1, B2 and B3) in the substrate 102. However, the disclosure is not limited thereto. In some alternative embodiments, the first doped wells (A1, A2, A3, A4 and A5) and the second doped wells (B1, B2 and B3) may be formed after forming the transfer gate Tx and the control electrode Va. In other words, doping of the substrate 102 may be performed to form various doped regions after forming the transfer gate Tx and the control electrode Va.

Figure 1D:
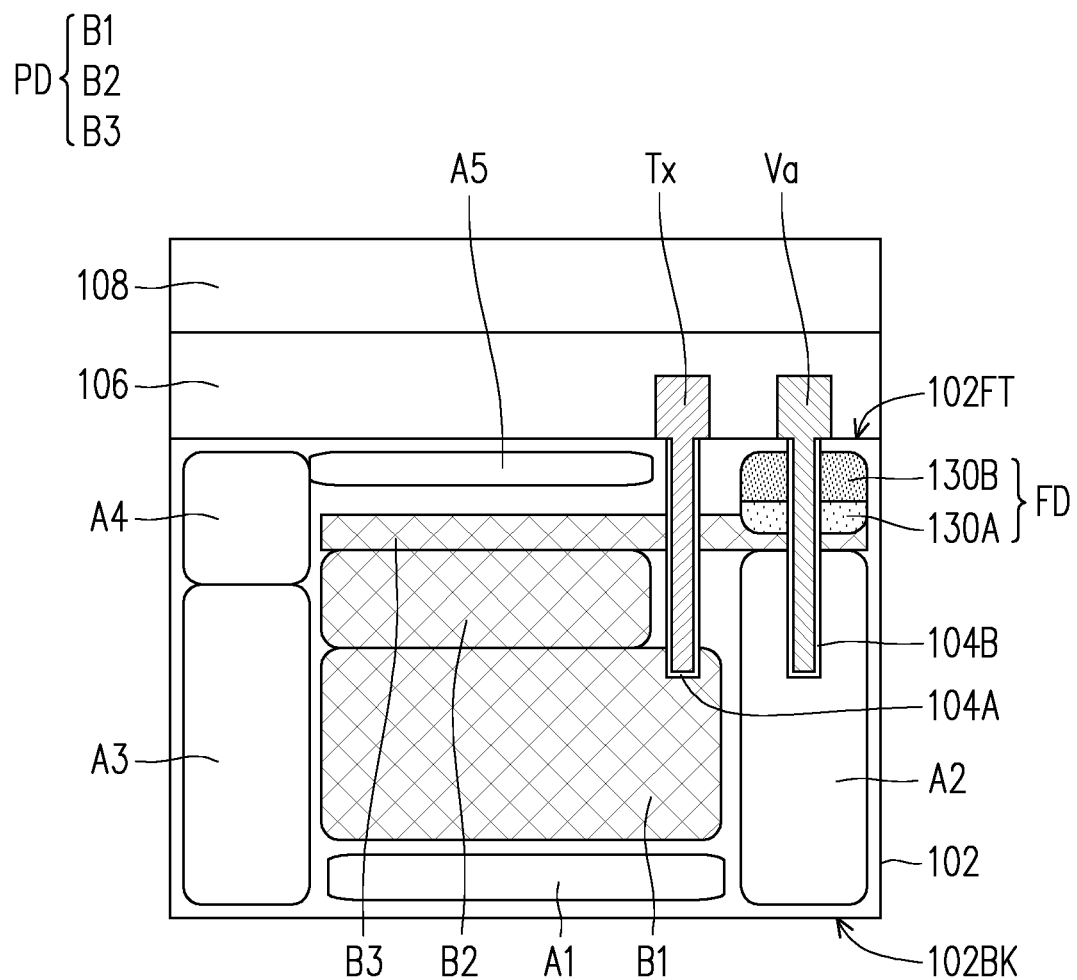

Referring to FIG. 1D, in a next step, one or more inter-level dielectric layers 106 may be formed over the transfer gate Tx and the control electrode Va to cover the transfer gate Tx and the control electrode Va. In some embodiments, the inter-level dielectric layers 106 may comprise one or more of a low-k dielectric layer (i.e., a dielectric with a dielectric constant less than about 3.9), an ultra low-k dielectric layer, or an oxide (e.g., silicon oxide). In some embodiments, a plurality of contacts (not shown) may be arranged within the inter-level dielectric layers 106 to be electrically connected to the transfer gate Tx, the control electrode Va, and may extend towards to the floating diffusion region FD. In the exemplary embodiment, a carrier substrate 108 may be further attached or bonded to the frontside 102FT of the substrate 102 through the inter-level dielectric layers 106. The carrier substrate 108 can be a handling wafer, an application-specific integrated circuit (ASIC), other sensing circuit, or any applicable structures that support, assist or collectively function with the image sensor circuitry.

Figure 1E:
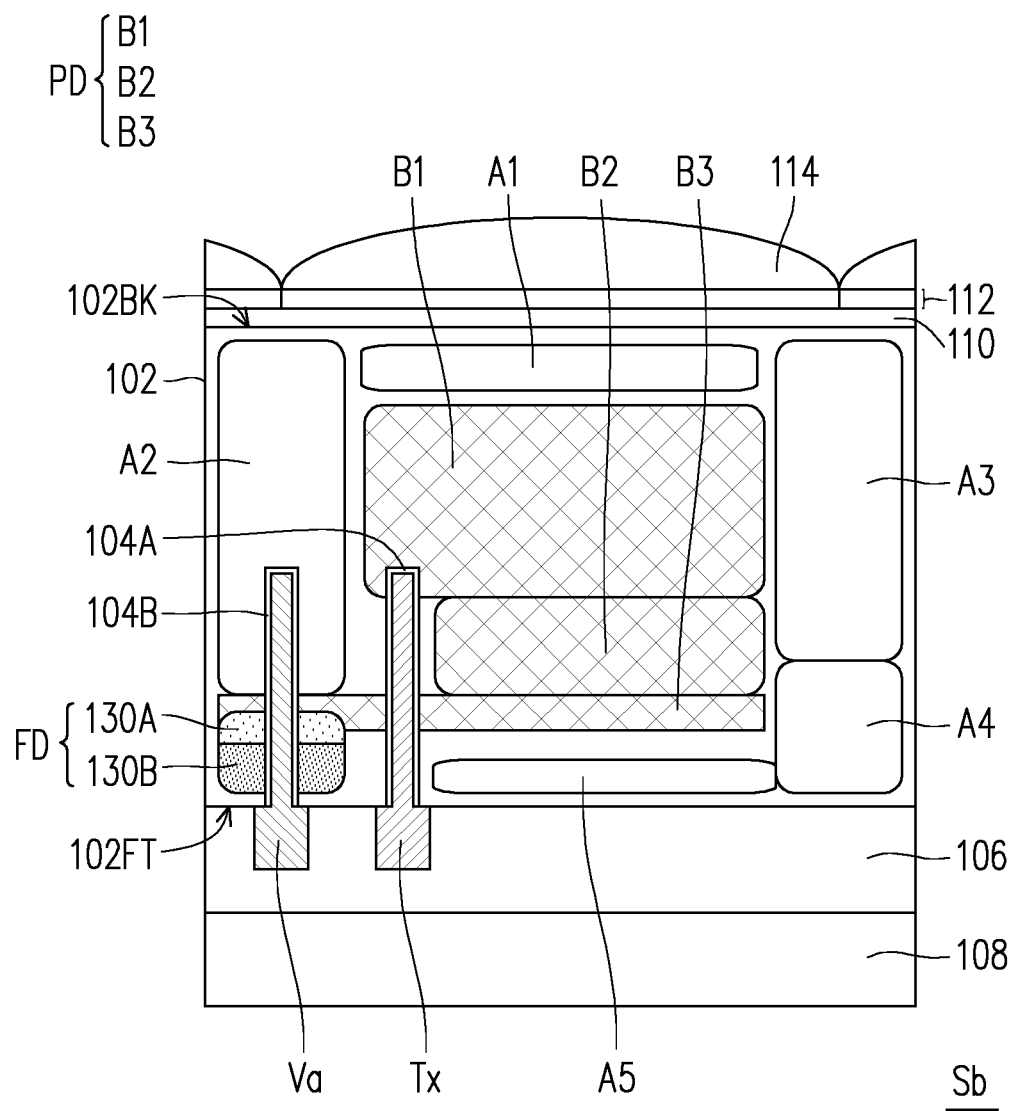

Referring to FIG. 1E, in some embodiments, an anti-reflection layer 110 is disposed over the backside 102BK of the substrate 102. In some embodiments, the anti-reflection layer 110 may comprise oxide, nitride, high-k dielectric material such as aluminum oxide (AlO), tantalum oxide (TaO), hafnium oxide (HfO), hafnium silicon oxide (HfSiO), hafnium aluminum oxide (HfAlO), or hafnium tantalum oxide (HfTaO), or the combination thereof. As further illustrated in FIG. 1E, a plurality of color filters 112 are arranged over the backside 102BK of the substrate 102 over the anti-reflection layer 110. For example, the anti-reflection layer 110 is sandwiched between the color filters 112 and the substrate 102. The plurality of color filters 112 are respectively configured to transmit specific wavelengths of incident radiation or incident light. For example, a first color filter (e.g., a red color filter) may transmit light having wavelengths within a first range, while a second color filter (e.g., a green color filter) may transmit light having wavelengths within a second range different than the first range. In some embodiments, the plurality of color filters 112 may be arranged within a grid structure overlying the substrate 102. In some embodiments, the grid structure may comprise a dielectric material.

Furthermore, in some embodiments, a plurality of micro-lenses 114 may be arranged over the plurality of color filters 112 over the backside 102BK of the substrate 102. In some embodiments, the micro-lenses 114 have a substantially flat bottom surface abutting the plurality of color filters 112 and a curved upper surface. In certain embodiments, the curved upper surface is configured to focus an incident radiation or incident light. During operation of the image sensor, the incident radiation or incident light is focused by the micro-lens 114 to the underlying photosensing region PD, where an electron-hole pair may be generated to produce a photocurrent. Up to here, a sub-pixel Sb of an image sensor according to some exemplary embodiments of the present disclosure may be accomplished.

Figure 2:
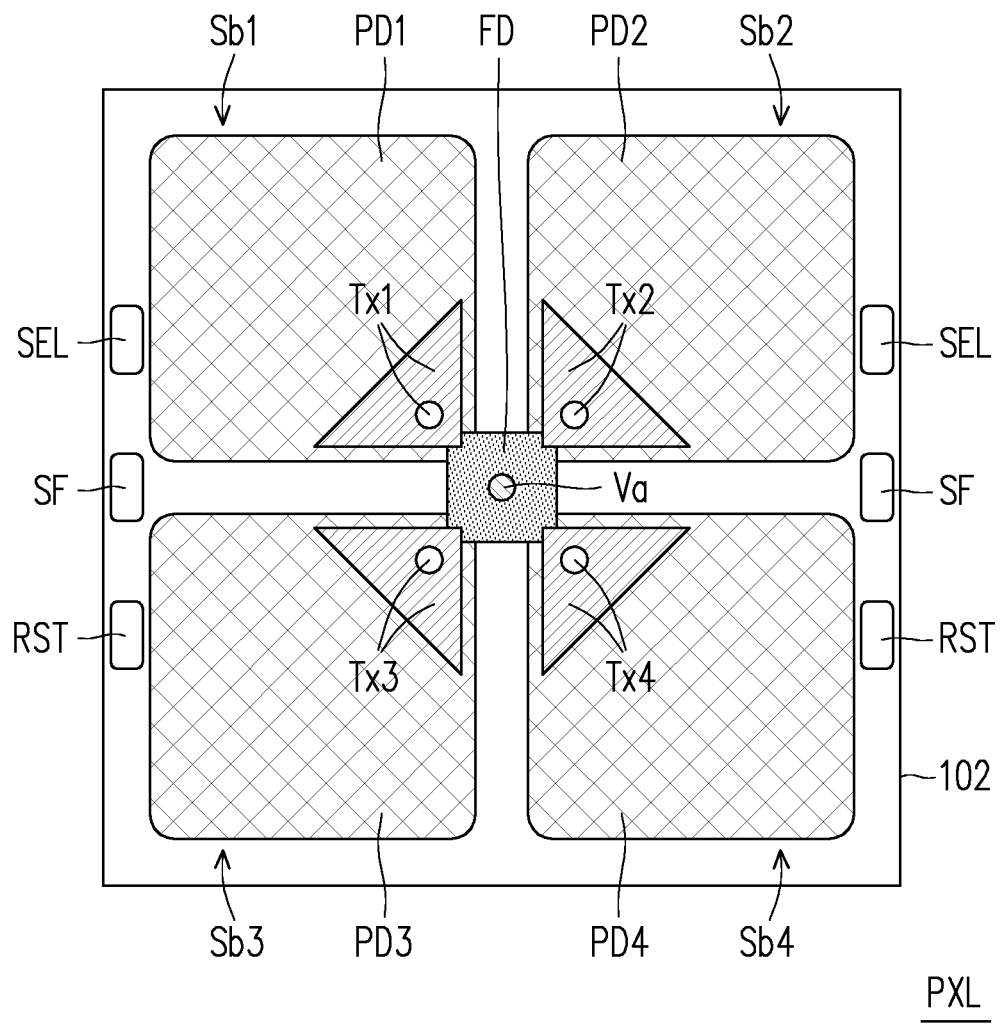
FIG. 2 is a schematic top view of a pixel according to some exemplary embodiments of the present disclosure.

FIG. 2 is a schematic top view of a pixel according to some exemplary embodiments of the present disclosure. As illustrated in FIG. 2, an image sensor including a pixel PXL having four sub-pixels (Sb1, Sb2, Sb3, Sb4) is described. However, the disclosure is not limited thereto. In some alternative embodiments, a pixel PXL may have three sub-pixels, or more than three sub-pixels depending on design requirement. The sub-pixels (Sb1, Sb2, Sb3, Sb4) described herein is the same as the sub-pixel Sb described in FIG. 1A to FIG. 1E. Therefore, similar reference numerals may be used to described the same or liked parts. Furthermore, the plurality of doped wells (first and second doped wells) are omitted from FIG. 2 for ease of illustration.

Referring to FIG. 2, in some embodiments, the pixel PXL includes four sub-pixels (Sb1, Sb2, Sb3, Sb4) arranged side by side. In the exemplary embodiment, the first sub-pixel Sb1 includes a first photosensing region PD1 located within the substrate 102, and a first transfer gate Tx1 extending into the first photosensing region PD1. The second sub-pixel Sb2 includes a second photosensing region PD2 located within the substrate 102, and a second transfer gate Tx2 extending into the second photosensing region PD2. The third sub-pixel Sb3 includes a third photosensing region PD3 located within the substrate 102, and a third transfer gate Tx3 extending into the third photosensing region PD3. Similarly, the fourth sub-pixel sb4 includes a fourth photosensing region PD4 located within the substrate 102, and a fourth transfer gate Tx4 extending into the fourth photosensing region PD4. In some embodiments, the photosensing regions (PD1, PD2, PD3, PD4) in each of the sub-pixels (Sb1, Sb2, Sb3 and Sb4) may be formed in the same steps. Furthermore, the transfer gates (Tx1, Tx2, Tx3, Tx4) in each of the sub-pixels (Sb1, Sb2, Sb3 and Sb4) may be formed in the same steps.

In the exemplary embodiment, the floating diffusion region FD is shared between the first photosensing region PD1, the second photosensing region PD2, the third photosensing region PD3 and the fourth photosensing region PD4. In other words, the image charges accumulated in each of the photosensing regions (PD1, PD2, PD3 and PD4) may be transferred to the same floating diffusion region FD for readout. In some embodiments, the floating diffusion region FD may be overlapped with the first photosensing region PD1, the second photosensing region PD2, the third photosensing region PD3 and the fourth photosensing region PD4. Furthermore, in some embodiments, the control electrode Va extends into the floating diffusion region FD and into the substrate 102, wherein the control electrode Va is capacitively coupled to the floating diffusion region FD.

In some embodiments, the pixel PXL of the image sensor may further comprise a plurality of reset transistors RST, a plurality of selection transistors SEL and a plurality of source follower transistors SF located on the substrate 102 adjacent to the transfer gates (Tx1, Tx2, Tx3, Tx4). In certain embodiments, the reset transistors RST, the selection transistors SEL and the source follower transistors SF are located on the frontside 102FT of the substrate 102 aside the transfer gates (Tx1, Tx2, Tx3, Tx4). In some embodiments, each of the reset transistors RST, the selection transistors SEL and the source follower transistors SF may comprise a gate electrode (not shown) disposed over the substrate 102 and a pair of source/drain (S/D) region (not shown) disposed within the substrate 102. During operation of the image sensor, the transfer gates (Tx1, Tx2, Tx3, Tx4) controls charge transfer from the photosensing regions (PD1, PD2, PD3 and PD4) to the floating diffusion region FD. If the charge level is sufficiently high within the floating diffusion region FD, the source follower transistor SF is activated and charges are selectively output according to operation of the selection transistor SEL used for addressing.

Figure 3:
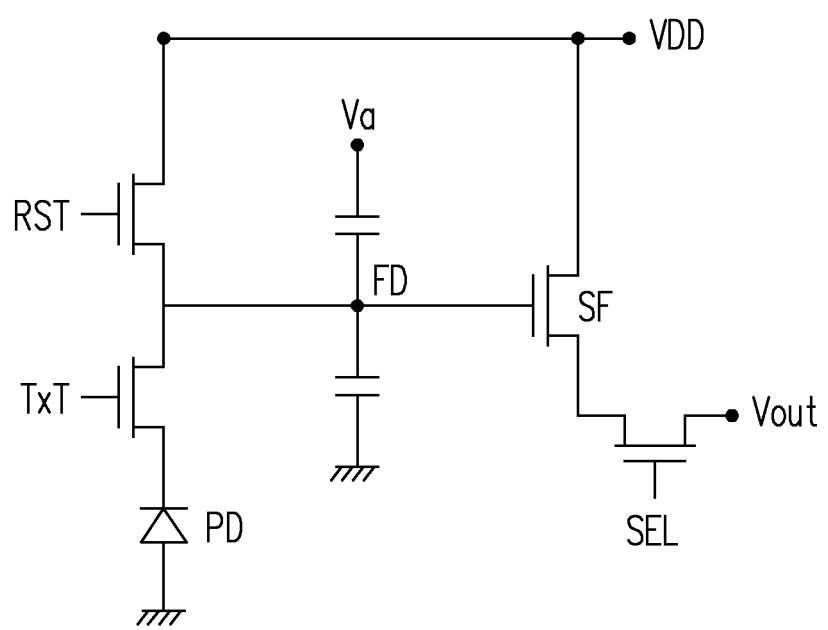
FIG. 3 is an equivalent circuit diagram of an image sensor according to some exemplary embodiments of the present disclosure.

FIG. 3 is an equivalent circuit diagram of an image sensor according to some exemplary embodiments of the present disclosure. In the exemplary embodiment, when incident light (containing photons of sufficient energy) strikes the photosensing region PD (which may be any of the photosensing regions PD1, PD2, PD3, PD4 mentioned above), an electron-hole pair is created, and photocurrent (or charges) are further produced. In some embodiments, a transfer gate transistor TxT (which may include any of the transfer gates Tx1, Tx2, Tx3, Tx4 mentioned above) provides the function of selectively transferring the charges or photocurrent to the floating diffusion region FD.

For example, in the exemplary embodiment, a bias may be applied to the transfer gate transistor TxT to generate an electrical field such that a channel for movement of the charges is created. In some embodiments, due to the electrical field generated, the charges stored in the photosensing region PD are pulled out and enters a channel of the transfer gate transistor TxT. Thereafter, these charges may travel through the channel of the transfer gate transistor TxT to arrive at the floating diffusion region FD.

As further illustrated in FIG. 3, the reset transistor RST is electrically connected between a DC voltage supply terminal VDD and the floating diffusion region FD to selectively clear charges at the floating diffusion region FD. For example, the reset transistor RST may discharge or charge the floating diffusion region FD to a preset voltage in response to a reset signal. In some embodiments, a bias may be applied to the control electrode Va, and the control electrode Va may be electrically coupled to the floating diffusion region FD to form a capacitor, so that the amount of charges accumulated in the floating diffusion region FD may be increased. A source follower transistor SF is electrically connected between VDD and an output Vout, and is gated by the floating diffusion region FD, to allow the charge level at the floating diffusion region FD to be observed without removing the charge. In some embodiments, the source follower transistor SF is able to provide high impedance output. For example, the source follower transistor SF may be an amplifier transistor which amplifies the signal of the floating diffusion region FD for readout operation. The selection transistor SEL (or row select transistor) is electrically connected between the source follower transistor SF and the output Vout to selectively output a voltage proportional to the charge at the floating diffusion region FD. Furthermore, a current source may be connected between the selection transistor SEL and the output Vout.

During operation, the image sensor is exposed to an optical image for a predetermined integration period. Over this period of time, the image sensor records the intensity of light incident on the photosensing region PD by accumulating charge proportional to the light intensity. After the predetermined integration period, the amount of accumulated charge is read. In some embodiments, the amount of accumulated charge for the photosensing region PD is read by momentarily activating the reset transistor RST to clear the charge stored at the floating diffusion region FD. Thereafter, the selection transistor SEL is activated and the accumulated charges of the photosensing region PD is transferred to the floating diffusion region FD by activating the transfer gate transistor TxT for a predetermined transfer period. During the predetermined transfer period, the voltage at the output Vout is monitored. As the charge is transferred, the voltage at the output Vout varies. After the predetermined transfer period, the change in the voltage observed at the output Vout is proportional to the intensity of light recorded at the photosensing region.

In the exemplary embodiment, the circuit diagram of an image sensor illustrated in FIG. 3 may be a driving circuit for performing a readout function. However, the circuit diagram of the image sensor shown in FIG. 3 is merely an example, and the disclosure is not limited thereto. In some alternative embodiments, the image sensor may have different circuit designs. For example, the driving circuit is depicted as a four transistor (4T) circuitry in FIG. 3. Nevertheless, in some alternative embodiments, the driving circuit DC may be a 3T circuitry, a 5T circuitry, or any other suitable circuitry.

Figure 4A:
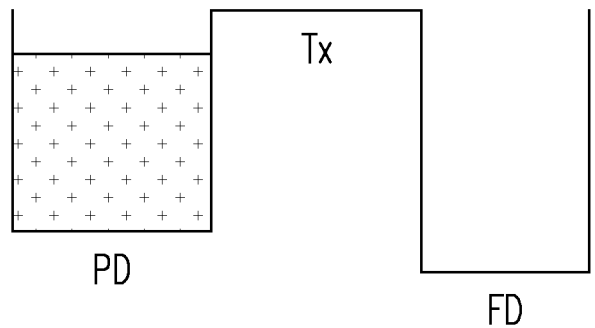
FIG. 4A to FIG. 4C are potential well diagrams showing charge transfer from a photosensing region to a floating diffusion region in an image sensor according to some comparative embodiments of the present disclosure.
Figure 4B:
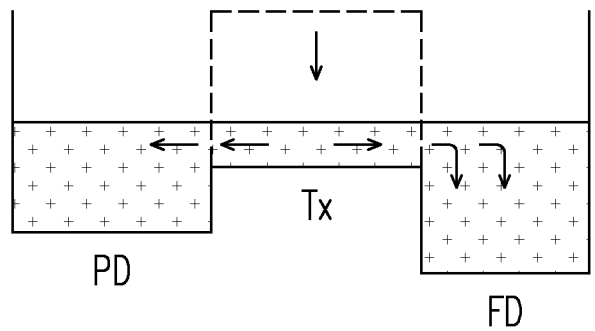
Figure 4C:
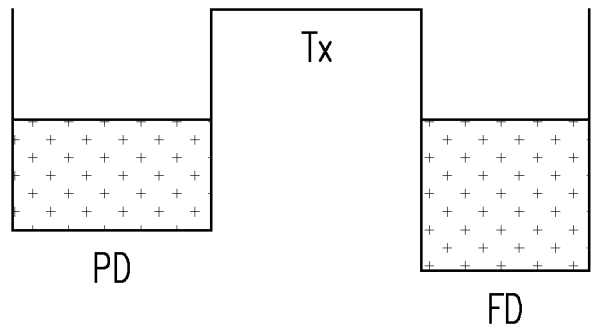

FIG. 4A to FIG. 4C are potential well diagrams showing charge transfer from a photosensing region to a floating diffusion region in an image sensor according to some comparative embodiments of the present disclosure. In the comparative embodiment shown in FIG. 4A to FIG. 4C, operation of an image sensor including all the elements of a sub-pixel Sb illustrated in FIG. 1E except for the control electrode Va is described. Referring to FIG. 4A, during operation of the image sensor, image charges are accumulated in the photosensing region PD. In some embodiments, a minimum potential or barrier potential that is controlled by the transfer gate Tx (or transfer gate transistor TxT) is located between the photosensing region PD and the floating diffusion region FD. Referring to FIG. 4B, when a bias is applied to the transfer gate Tx (or when transfer gate transistor TxT is turned on), the barrier potential is lowered, which allows the charges accumulated in the photosensing region PD to be transferred to the floating diffusion region FD. Referring to FIG. 4C, after closing down the transfer gate Tx, the charges stored in the floating diffusion region FD is readout to selectively output the image data. In some embodiments, depending on the ability of the floating diffusion region FD to store the charges, the accumulated charges in the photosensing region PD may not be completely depleted or transferred. For example, in the comparative embodiment, the full well capacity of the floating diffusion region FD may be reached (see FIG. 4B). As such, some of the accumulated charges may overflow back to the photosensing region PD. As a result, blooming may occur, which may in turn effect the quality of the outputted image.

Figure 5A:
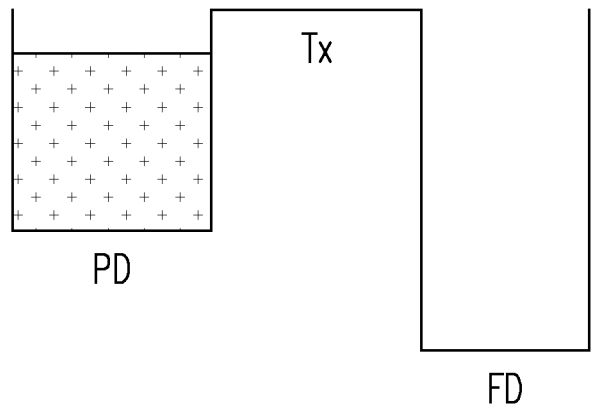
FIG. 5A to FIG. 5C are potential well diagrams showing charge transfer from a photosensing region to a floating diffusion region in an image sensor according to some exemplary embodiments of the present disclosure.
Figure 5B:
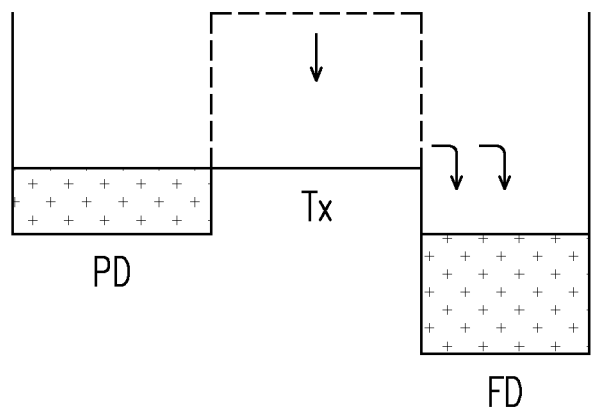
Figure 5C:
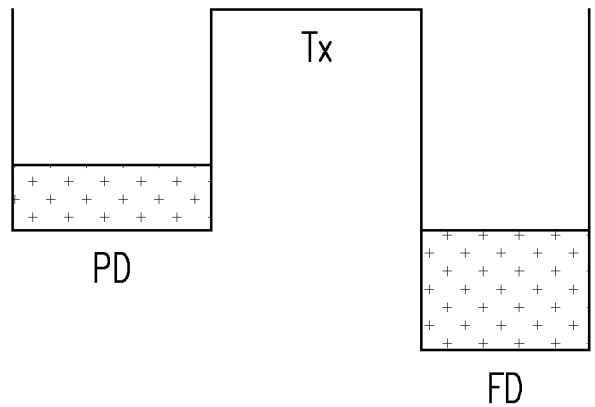

FIG. 5A to FIG. 5C are potential well diagrams showing charge transfer from a photosensing region to a floating diffusion region in an image sensor according to some exemplary embodiments of the present disclosure. In the exemplary embodiment shown in FIG. 5A to FIG. 5C, the operation of an image sensor including all the elements of a sub-pixel Sb illustrated in FIG. 1E (with control electrode Va) is described. Referring to FIG. 5A, during operation of the image sensor, image charges are accumulated in the photosensing region PD. In some embodiments, the minimum potential or barrier potential controlled by the transfer gate Tx (or transfer gate transistor TxT) is the same as that described in FIG. 4A. However, due to the presence of a control electrode (Va) that is capacitively coupled to the floating diffusion region FD during readout, the amount of charges (voltages) accumulated in the floating diffusion region FD may be raised or increased. As such, referring to FIG. 5B, when a bias is applied to the transfer gate Tx (or when transfer gate transistor TxT is turned on), the barrier potential is lowered, which allows the charges accumulated in the photosensing region PD to be transferred to the floating diffusion region FD without overflow. Thereafter, referring to FIG. 4C, after closing down the transfer gate Tx, the charges stored in the floating diffusion region FD is readout to selectively output the image data. In the exemplary embodiment, the control electrode Va is used to increase the full well capacity of the floating diffusion region FD, and the blooming effect may be mitigated.

In the above-mentioned embodiments, the image sensor includes a pixel having a control electrode capacitively coupled to the floating diffusion region. As such, during operation of the image sensor, the full well capacity of the floating diffusion region FD may be increased and the amount of charges stored in the floating diffusion region FD may be raised. Overall, the blooming effect may be mitigated and the performance of the image sensor may be improved. The image sensor may also be useful in dual conversion gain applications.

In accordance with some embodiments of the present disclosure, a photosensing pixel includes a substrate, a photosensing region, a floating diffusion region, a transfer gate and a control electrode. The photosensing region is located within the substrate. The floating diffusion region is located within the substrate aside the photosensing region. The transfer gate is disposed on the substrate and extending into the photosensing region. The control electrode is located on the substrate and extending into the floating diffusion region.

In accordance with some other embodiments of the present disclosure, an image sensor includes a plurality of pixels. At least one pixel among the plurality of pixels includes a first photosensing region, a first transfer gate, a second photosensing region, a second transfer gate, a floating diffusion region, and a control electrode. The first photosensing region is located within a substrate. The first transfer gate is disposed on a frontside the substrate and extending into the first photosensing region. The second photosensing region is located within the substrate. The second transfer gate is disposed on the frontside of the substrate and extending into the second photosensing region. The floating diffusion region is disposed from the frontside of the substrate to a position within the substrate, wherein the floating diffusion region is shared between the first photosensing region and the second photosensing region. The control electrode is located on the frontside of the substrate and extending into the floating diffusion region.

In accordance with yet another embodiment of the present disclosure, a method of fabricating an image sensor is described. The method includes the following steps. A substrate is doped with a first dopant. A first photosensing region is formed within the substrate by doping the substrate with a second dopant different than the first dopant. A floating diffusion region is formed within the substrate aside the first photosensing region. A first transfer gate is formed on a frontside of the substrate and extending into the first photosensing region. A control electrode is formed on the frontside of the substrate and extending into the floating diffusion region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor comprising a plurality of pixels, and at least one pixel among the plurality of pixels comprises:
   a first photosensing region located within a substrate;
   a first transfer gate disposed on a frontside the substrate and extending into the first photosensing region;
   a second photosensing region located within the substrate;
   a second transfer gate disposed on the frontside of the substrate and extending into the second photosensing region;
   a floating diffusion region disposed from the frontside of the substrate to a position within the substrate, wherein the floating diffusion region is shared between the first photosensing region and the second photosensing region; and
   a control electrode located on the frontside of the substrate and extending into the floating diffusion region.

2. The image sensor according to claim 1, wherein the at least one pixel among the plurality of pixels further comprises:
   a third photosensing region located within the substrate;
   a third transfer gate disposed on the substrate and extending into the third photosensing region;
   a fourth photosensing region located within the substrate; and
   a fourth transfer gate disposed on the substrate and extending into the fourth photosensing region,
   wherein the floating diffusion region is shared between the first photosensing region, the second photosensing region, the third photosensing region and the fourth photosensing region.

3. The image sensor according to claim 1, further comprising:
   a first gate dielectric located within the substrate separating the first transfer gate from the first photosensing region, and
   a second gate dielectric located within the substrate separating the second transfer gate from the second photosensing region.

4. The image sensor according to claim 1, wherein the floating diffusion region is located on a first doped well of the substrate having a first conductivity type, and the floating diffusion region comprises a lightly doped well of a second conductivity type located on the first doped well, and a heavily doped well of the second conductivity type located on the lightly doped well.

5. The image sensor according to claim 4, wherein the control electrode extends into the floating diffusion region and into the substrate so that it is surrounded by the first doped well, the lightly doped well and the heavily doped well.

6. The image sensor according to claim 4, further comprising a dielectric layer located within the substrate separating the control electrode from the floating diffusion region, wherein the control electrode is capacitively coupled to the floating diffusion region.

7. The image sensor according to claim 1, further comprising color filters and micro-lenses located on a backside of the substrate opposite to the frontside.

* * * * *